United States Patent [19]

Suzuki et al.

[11] 4,437,057

[45] Mar. 13, 1984

[54] FREQUENCY DETECTION SYSTEM

[75] Inventors: Sunao Suzuki, Kobe; Koji Maeda, Takatsuki, both of Japan

[73] Assignee: Mitsubishi Denki Kabushiki Kaisha, Tokyo, Japan

[21] Appl. No.: 342,917

[22] Filed: Jan. 26, 1982

[30] Foreign Application Priority Data

Feb. 10, 1981 [JP] Japan .................................. 56-18609

[51] Int. Cl.³ ............................................. G01R 23/02
[52] U.S. Cl. .................................. 324/78 R; 324/77 A
[58] Field of Search ................ 324/77 R, 77 A, 77 B, 324/77 D, 78 R, 78 D, 79 R, 79 D

[56] References Cited

U.S. PATENT DOCUMENTS

| | | | |
|---|---|---|---|
| 2,280,524 | 4/1942 | Hansen | 324/77 A |
| 2,995,727 | 8/1961 | Quade | 324/77 A |
| 3,454,876 | 7/1969 | Huang | 324/77 A |

OTHER PUBLICATIONS

Masamitsu Kawakami, "Electronic Circuits IV", pp. 166–167, Jul. 1966, Kyoritsu-Sha.
Data Sheet for Frequency Relay Type FCX 103, published by Brown Boveri and Company Ltd., publication date unknown.

*Primary Examiner*—Michael J. Tokar
*Attorney, Agent, or Firm*—Wenderoth, Lind & Ponack

[57] ABSTRACT

The disclosed frequency detection system samples a sinusoidal input V(t) with a predetermined constant sampling period h to form four sampled values $V(t_o-2h)$, $V(t_o-h)$, $V(t_o+th)$ and $V(t_o+2h)$ and calculates $$y(h) = \frac{V(t_o + 2h) - V(t_o - 2h)}{V(t_o + h) - V(t_o - h)} = 2\cos\omega h$$

where $\omega$ designates an angular frequency of the sinusoidal input after the conversion to corresponding digital values to provide a measure of its frequency. Further the absolute value of the frequency may be obtained by making an arc-cosine of one half the y(h).

2 Claims, 4 Drawing Figures

FREQUENCY DETECTION SYSTEM

BACKGROUND OF THE INVENTION

This invention relates to a frequency detection system for detecting a frequency of an electric power system by digitally processing an electrical quantity, for example, a voltage magnitude thereof.

A conventional frequency detection system of the type referred to has comprised a rectangular waveform converter circuit for converting an AC waveform flowing through an electric power system to be detected to a rectangular waveform having a duration equal to that of a positive half cycle thereof, an "AND" circuit connected to both the rectangular waveform converter circuit and an oscillation circuit for generating a train of rectangular pulses having a predetermined pulse repetition frequency, to produce a sequence of rectangular pulse resulting from the logical sum of the rectangular waveform and the rectangular pulses, and a pulse counter for counting rectangular pulses from the "AND" circuit to produce a count in a binary form. The count from the pulse counter is compared with a frequency in a binary form set in a setting circuit to determine whether the frequency of the electric power system is higher or lower than that set in the setting circuit.

Conventional frequency detection system such as described above have been disabled to detect the absolute value of the frequency of electric power systems. Also in measuring systems including the computer to measure electrical quantities, voltages and the like can be determined and only the measurement of the frequency has required the use of a quite different instrument. However such an instrument has been unabled to be assembled in an associated computer system.

Accordingly it is an object to provide a new and improved frequency detection system for detecting a frequency of an electric power system and also determining the absolute value thereof.

SUMMARY OF THE INVENTION

The present invention provides a frequency detection system comprising sampling means for sampling an AC input V(t) having a frequency to be detected with a predetermined constant sampling period h to form sampled values $V(t_o-2h)$, $V(t_o-h)$, $V(t_o+h)$ and $V(t_o+2h)$ where $t_o$ designates any desired time point, and calculating means for calculating $$y(h) = \frac{V(t_o + 2h) - V(t_o - 2h)}{V(t_o + h) - V(t_o - h)},$$

to provide a measure of the frequency of the AC input.

Preferably the frequency detection system may comprise another calculating means for calculating an arccosine function of the y(h) to detect the absolute value of the frequency of the AC input.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
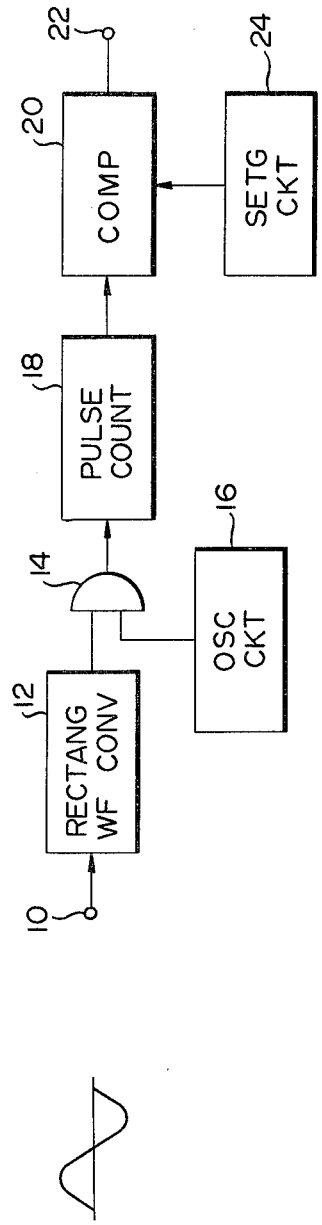
FIG. 1 is a block diagram of a conventional frequency detection system.

Referring now to FIG. 1 of the drawings, there is illustrated a conventional frequency detection system. The arrangement illustrated comprises an input terminal 10, a rectangular waveform converter circuit 12 connected to the input terminal 10, and an "AND" circuit 14 including one input connected to the rectangular waveform converter circuit 12, the other input connected to an oscillation circuit 16 and an output connected to a binary counter 18. Then the binary counter 18 is connected to one input to comparator circuit 20 subsequently connected to an output terminal 22. Also the comparator circuit 20 includes the other input connected to a setting circuit 24 having a binary number set to a predetermined frequency with which a frequency of an AC input is compared.

The operation of the arrangement shown in FIG. 1 will now be described in conjunction with FIG. 2 wherein there are illustrated waveforms developed at various points therein. The rectangular waveform converter circuit 12 receives via the input terminal 10 an AC input shown at a sinusoidal wave (b) in FIG. 2 having a period T. The AC input is also shown beside the input terminal 10 in FIG. 1 as being of a sinusoidal wave. The converter circuit 12 converts the positive half cycle of the AC input to a rectangular waveform having a duration equal to that T/2 of the positive half cycle as shown at waveform (c) in FIG. 2 That rectangular waveform (c) is applied to the one input to the "AND" circuit 14 also applied with a train of rectangular pulses from the oscillation circuit 16. The train of rectangular pulses generated by the oscillation circuit 16 has a predetermined pulse repection frequency as shown at waveform (a) in FIG. 2.

Figure 2:
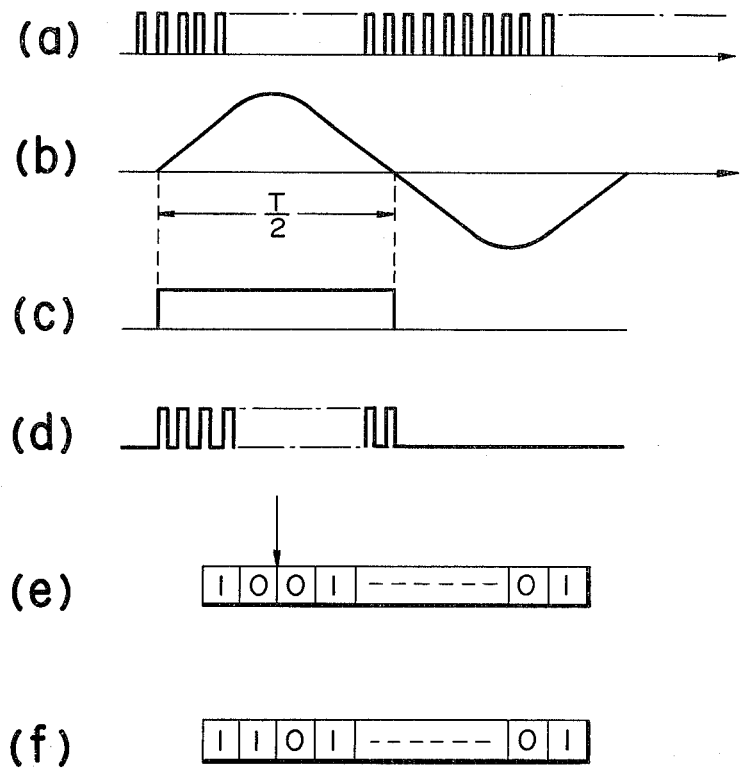
FIG. 2 is a graph illustrated waveforms developed at various points in the arrangement shown in FIG. 1.

The "AND" circuit 14 forms the logical sum of the rectangular waveform from the rectangular waveform converter circuit 12 and rectangular pulses from the oscillator circuit 16 to deliver to the binary counter 18 a pulse sequence as shown at waveform (d) in FIG. 2.

The binary counter 18 counts pulses included in the pulse sequence applied thereto to supply its count in the binary form to comparator circuit 20. In the example illustrated the count from the counter 18 is shown in a row labelled (e) as being of a binary number (1001 ... 01).

On the other hand, the setting circuit 24 includes a binary value set to that frequency with which the frequency of the AC input is compared as described above. In this case the set value is of a binary number (1101 .. . 01) as shown at the lowermost row labelled (f) in FIG. 2.

The comparator circuit 20 compares the count from the binary counter 18 with set value from the setting circuit 24 to determine which of the two is larger.

Assuming now that n designates the set value from the setting circuit 24 and Δf designates the pulse repetition frequency of the pulses generated by the oscillation circuit 16, the frequency f of the AC input may be expressed by f=Δf/2n Therefore when n and Δf are known the comparator circuit 20 can determines whether the frequency of the AC input is larger or smaller than the set value from the setting circuit 24. In the example illustrated the frequency of the AC input is smaller than the set value as will readily be understood from the binary numbers shown at the rows (e) and (f) respectively.

From the foregoing it is seen that conventional frequency detection systems such as shown in FIG. 1 has been disabled to detect the absolute value of the frequency of AC inputs applied thereto. Also in measuring systems including the computer to measure electrical quantities, voltages and the like can be determined and only the measurement of the frequency has required a quite different instrument. However, it has been impossible to assemble such an instrument into an associated computer system.

The present invention contemplates to eliminate the disadvantages of the prior art practice as described above and provides a frequency detection system arranged to sample an AC input with a sampling period h to form sampled values $V(t_o-2h)$, $V(t_o-h)$, $V(t_o+h)$ and $V(t_o+2h)$ and calculate $$y(h) = \frac{V(t_o + 2h) - V(t_o - 2h)}{V(t_o + h) - V(t_o - h)}$$

to detect provide a measure of frequency of the AC input.

Preferably the frequency detection system may further calculate an arc-cosine of one half the y(h) to detect the absolute value of the frequency of the AC input.

Figure 4:
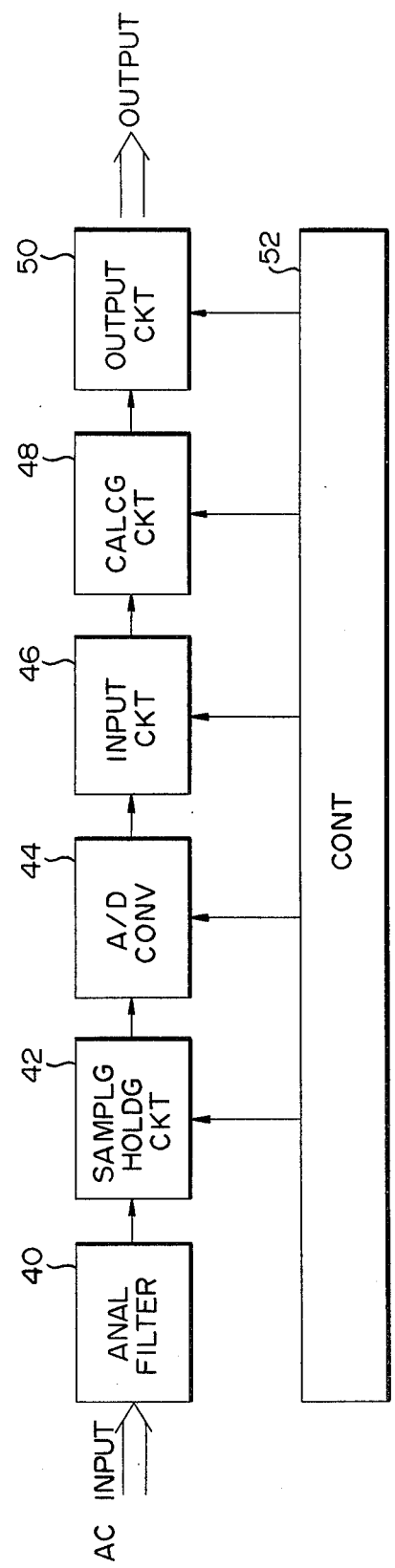
FIG. 4 is a block diagram of one embodiment according to the frequency detection system of the present invention.
Figure 3:
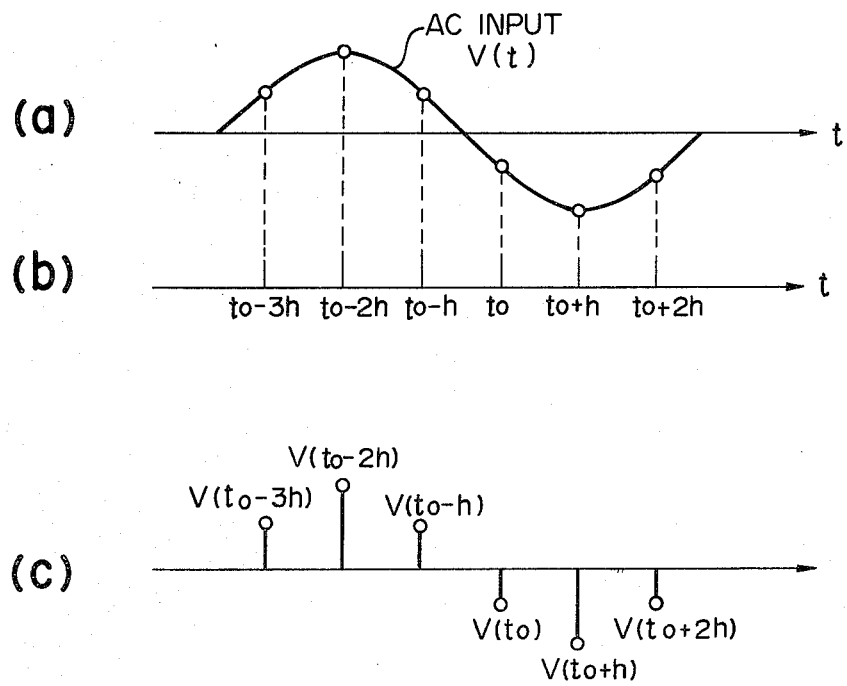
FIG. 3 is a graph useful in explaining the sampling according to the present invention.

One embodiment of the present invention will now be described in conjunction with FIGS. 3 and 4. FIG. 3 shows the manner in which the AC input is sampled in accordance with the present invention while FIG. 4 is a block diagram of the embodiment of the present invention. In FIG. 3 the uppermost portion (a) shows an AC input in the form of a sinusoidal wave having a frequency to be be determined, an intermediate portion (b) shows sampling positions disposed at predetermined equal intervals h along the time axis and the lowermost portion (c) shows values of the AC input sampled at the sampling positions at vertical lines.

It is now assumed that the AC input V(t) is expressed by $$V(t) = V \sin \omega t$$

where V designates the peak value of the AC input and ω designates an angular velocity thereof. Under the assumed conditions, the AC input is sampled at time points $t_o-2h$, $t_o-h$, $t_o+h$ and $t_o+2h$ respectively where $t_o$ designates any desired time point. Then sampled values may be expressed by $$V(t_o - 2h) = V\sin\omega(t_o - 2h) \quad (1)$$

$$V(t_o - h) = V\sin\omega(t_o - h) \quad (2)$$

$$V(t_o + h) = V\sin\omega(t_o + h) \quad (3)$$

and $$V(t_o + 2h) = V\sin\omega(t_o + 2h) \quad (4)$$

respectively. By defining y(h) by $$y(h) = \frac{V(t_o + 2h) - V(t_o - 2h)}{V(t_o + h) - V(t_o - h)} \quad (5)$$

the y(h) is calculated at $$y(h) = \frac{\sin\omega(t_o + 2h) - \sin\omega(t_o - 2h)}{\sin\omega(t_o + h) - \sin\omega(t_o - h)} \quad (6)$$

$$= \frac{\sin\omega t_o \cos 2\omega h + \cos\omega t_o \sin 2\omega h - \sin\omega t_o \cos 2\omega h + \cos\omega t_o \sin 2\omega h}{\sin\omega t_o \cos\omega h + \cos\omega t_o \sin\omega h - \sin\omega t_o \cos\omega h + \cos\omega t_o \sin\omega h}$$

$$= \frac{2\cos\omega t_o \sin 2\omega h}{2\cos\omega t_o \sin\omega h}$$

$$= 2\cos\omega h$$

From the expression (6) is seen that the y(h) is quite independent of the peak value V of the AC input or voltage and is a function of the angular frequency alone because the sampling interval or period is a constant. Since the angular frequency ω is defined by $\omega = 2\lambda f$ where f designates the frequency of the AC input, the expression (6) has a value as determined only by the frequency f. By inversely solving the expression (6) with respect to the y(h), $$f = \frac{1}{2\pi h} \cos^{-1} \frac{y(h)}{2} \quad (7)$$

results.

Thus one can directly calculate the frequency from the expression (7). That is, one can detect the absolute value of the frequency.

FIG. 4 shows one embodiment according to the frequency detection system of the present invention for effecting the sampling and calculations as described above. The arrangement illustrated comprises an analog filter 40, a sampling and holding circuit 42 and an analog-to digital converter circuit 44 serially interconnected in the named order.

An AC input such as shown at waveform (a) in FIG. 3 is passed through the analog filter 40 which eliminates folding error from the sampling and holding circuit and then sampled with the sampling period h to form sampled values $V(t_o-2h)$, $V(t_o-h)$, $V(t_o+h)$ and $V(t_o+2h)$ as described above in conjunction with FIG. 3. Those sampled values are temporarily held in the circuit 42 and then successively applied to the analog-to-digital converter circuit 44 where they are converted to corresponding digital values.

The converted digital values are supplied to an input circuit 46 forming a computer with a calculating circuit 48 and an output circuit 50 connected in series to each other. The calculating circuit 48 receives the digital value through the input circuit 46 and uses them to effect calculations in accordance with the expressions (5) and (6) to detect or determine the frequency of the AC input. The frequency thus detected or determined is deliver via the output circuit 50 to an output connected to the latter.

The components 42, 44, 46, 48 and 50 are connected to a control circuit 52 to be controlled thereby.

From the foregoing it is seen that, according to the present invention, an AC input having a frequency to be detected is sampled with a predetermined constant sampling period to form four consecutive sample which, are, in turn, calculated following the expression (5) to provide a measure of the frequency. Also the measure of the frequency can be calculated following the expression (6) to provide the absolute value of the frequency.

While the present invention has been illustrated and described in conjunction with a single preferred embodiment thereof it is to be understood that numerous changes and modifications may be resorted to without departing from the spirit and scope of the present invention.

What is claimed is:

1. A frequency detection system comprising sampling means for sampling an AC input V(t) having a frequency to be detected with a predetermined constant sampling period h to form sampled values $V(t_o-2h)$, $V(T_o-h)$, $V(t_o+h)$ and $V(t_o+2h)$ where $t_o$ designates any desired time point, and calculating means for calculating $$y(h) = \frac{V(t_o + 2h) - V(t_o - 2h)}{V(t_o + h) - V(t_o - h)}$$

to provide a measure of said frequency of said AC input.

2. A frequency detection system as claimed in claim 1 wherein there is provided another calculating means for calculating an arc-cosine function of the y(h) recited in claim 1 to detect the absolute value of said frequency of said AC input.

* * * * *